United States Patent
Nishida

(10) Patent No.: US 8,368,363 B2
(45) Date of Patent: Feb. 5, 2013

(54) CURRENT SENSING CIRCUIT AND SWITCHING REGULATOR INCLUDING THE SAME

(75) Inventor: Junji Nishida, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 212 days.

(21) Appl. No.: 12/991,844

(22) PCT Filed: May 14, 2009

(86) PCT No.: PCT/JP2009/059305
§ 371 (c)(1), (2), (4) Date: Nov. 9, 2010

(87) PCT Pub. No.: WO2009/147949
PCT Pub. Date: Dec. 10, 2009

(65) Prior Publication Data
US 2011/0068762 A1    Mar. 24, 2011

(30) Foreign Application Priority Data
Jun. 2, 2008  (JP) ................... 2008-144173

(51) Int. Cl.
*G05F 1/618* (2006.01)
*G05F 1/565* (2006.01)

(52) U.S. Cl. .................... 323/225; 323/282

(58) Field of Classification Search ............. 323/223, 323/224, 225, 265, 268, 271, 282, 284, 285, 323/315, 316, 351
See application file for complete search history.

(56) References Cited

U.S. PATENT DOCUMENTS

| | | | | |
|---|---|---|---|---|
| 6,160,388 A * | 12/2000 | Skelton et al. | | 323/282 |
| 6,700,365 B2 * | 3/2004 | Isham et al. | | 323/317 |
| 6,765,372 B2 * | 7/2004 | Isham | | 323/224 |
| 6,933,706 B2 * | 8/2005 | Shih | | 323/222 |
| 7,141,955 B1 * | 11/2006 | Martinez | | 323/272 |
| 7,151,361 B2 * | 12/2006 | Xi | | 323/222 |
| 7,420,356 B2 | 9/2008 | Hojo | | |
| 7,560,911 B2 | 7/2009 | Nishida | | |
| 7,576,530 B2 | 8/2009 | Nishida | | |
| 7,679,349 B2 * | 3/2010 | Kaplish | | 323/282 |
| 7,679,942 B2 | 3/2010 | Nishida | | |
| 7,683,593 B2 * | 3/2010 | Tao | | 323/277 |
| 7,777,467 B2 | 8/2010 | Nishida | | |
| 7,795,846 B2 * | 9/2010 | Martin | | 323/222 |
| 7,804,285 B2 | 9/2010 | Nishida | | |

(Continued)

FOREIGN PATENT DOCUMENTS

| | | |
|---|---|---|
| JP | 2005-237099 | 9/2005 |
| JP | 2007-78427 | 3/2007 |

(Continued)

OTHER PUBLICATIONS

International Search Report in PCT/JP2009/059305.

*Primary Examiner* — Gary L Laxton
(74) *Attorney, Agent, or Firm* — Cooper & Dunham LLP

(57) ABSTRACT

A current sensing circuit configured to sense current flowing through a switching transistor of a non-insulated switching regulator, the current sensing circuit includes a voltage divider circuit portion; a first transistor; a first impedance element; a second transistor; a third transistor; and a first voltage comparing circuit portion, wherein control terminals of the first transistor, the second transistor, and the third transistor are connected to each other and a connecting portion of the control terminals is connected to a connecting portion between the third transistor and the first constant current source.

14 Claims, 7 Drawing Sheets

U.S. PATENT DOCUMENTS

| | | | |
|---|---|---|---|
| 2007/0263334 A1 | 11/2007 | Nishida | |
| 2008/0024098 A1 | 1/2008 | Hojo | |
| 2008/0068054 A1 | 3/2008 | Nishida | |
| 2008/0203990 A1 | 8/2008 | Nishida | |
| 2008/0315850 A1 | 12/2008 | Nishida | |
| 2009/0001951 A1 | 1/2009 | Hojo | |
| 2009/0085540 A1 | 4/2009 | Nishida | |
| 2009/0174384 A1 | 7/2009 | Michishita et al. | |
| 2009/0322298 A1 | 12/2009 | Nishida | |
| 2010/0134085 A1 | 6/2010 | Nishida | |

FOREIGN PATENT DOCUMENTS

| | | |
|---|---|---|
| JP | 2007-241411 | 9/2007 |
| JP | 2007-252137 | 9/2007 |
| JP | 2007-252197 | 9/2007 |
| JP | 2008-58992 | 3/2008 |
| JP | 2008-72786 | 3/2008 |
| JP | 2008-72833 | 3/2008 |
| JP | 2008-72835 | 3/2008 |
| JP | 2008-131746 | 6/2008 |
| JP | 2008-131747 | 6/2008 |
| JP | 2008-178263 | 7/2008 |
| JP | 2008-206366 | 9/2008 |
| JP | 2008-228514 | 9/2008 |
| JP | 2009-5442 | 1/2009 |
| JP | 2009-65772 | 3/2009 |
| JP | 2009-71951 | 4/2009 |
| JP | 2009-291057 | 12/2009 |
| JP | 2010-11617 | 1/2010 |
| JP | 2010-88216 | 4/2010 |
| JP | 2010-136497 | 6/2010 |
| WO | WO2009/031673 | 3/2009 |
| WO | WO2009/034810 | 3/2009 |
| WO | WO2009/147949 | 12/2009 |

* cited by examiner

CURRENT SENSING CIRCUIT AND SWITCHING REGULATOR INCLUDING THE SAME

TECHNICAL FIELD

The present invention generally relates to a current sensing circuit of a switching regulator which forms a DC-DC converter, and particularly relates to a current sensing circuit which individually senses currents flowing through a switching transistor and a synchronous circuit rectifier transistor.

BACKGROUND ART

Conventionally, it has been a popular method to sense current flowing through a switching transistor or a synchronous circuit rectifier transistor of a switching regulator, which forms a DC-DC converter, by sensing a voltage across a resistor which is inserted in series with the switching transistor or the synchronous circuit rectifier transistor.

Since the resistor in the method uses a lot of electricity, power conversion efficiency is decreased. Moreover, an additional step such as wave trimming etc. becomes necessary to sense current with a high degree of accuracy because of a low setup accuracy of a resistance included in a semiconductor.

FIG. 1 shows a schematic drawing showing a conventional circuit for sensing current. The shown circuit is arranged in order to resolve the problem described above and is disclosed in, for example, patent document 1.

The circuit shown in FIG. 1 senses that the current value of the current flowing through a switching transistor M101, which is formed of a PMOS transistor, reaches a predetermined value. PMOS transistors M103 and M104 are connected to the switching transistor M101 in parallel to each other. The PMOS transistor M103 of which a gate is connected to the GND, is in a conduction state, i.e. on-state. The PMOS transistor M104 of which a gate is connected to a gate of the switching transistor M101, is turned on/off in synchronization with the switching transistor M101.

A PMOS transistor M105 of which a source is connected to an input power source Vin and a gate thereof is connected to the GND, is in a conduction state, i.e. on-state. PMOS transistors M106~M109 are connected to form a cascade current mirror circuit. A source of the PMOS transistor M106 is connected to a drain of the PMOS transistor M103, and a drain of the PMOS transistor M106 is connected to a source of the PMOS transistor M108. A source of the PMOS transistor M107 is connected to a drain of the PMOS transistor M105, and a drain of source of the PMOS transistor M107 is connected to a source of the PMOS transistor M109.

Each gate of the PMOS transistors M106 and M107 is connected to a drain of the PMOS transistor M108. Each gate of the PMOS transistors M108 and M109 is connected to one end of a resistor R101 of which the other end is connected to the drain of the PMOS transistor M108. A current source 101 is inserted between the other end of the resistor R101 and the GND. A current source 102 is inserted between a drain of the PMOS transistor M109 and the GND.

In such a circuit configuration described above, when the current value of the current flowing through the switching transistor M101 is relatively low, a drain voltage of the PMOS transistor M103 is increased to a voltage close to input voltage Vin. And then the current flowing through the PMOS transistors M106 and M108 becomes greater than the current flowing through the PMOS transistors M107 and M109. Thus, a voltage of an excess current output terminal OUTa becomes closer to the GND voltage. On the other hand, when the current flowing through the switching transistor M101 starts to increase, the current flowing through the PMOS transistors M103 and M104 starts to increase. And then the drain voltage of the PMOS transistor M103 starts to decrease. When the drain voltage of the PMOS transistor M103 becomes lower than the drain voltage of the PMOS transistor M105, the excess current output terminal OUTa outputs a high level signal.

[Patent Document 1] Japanese Patent Laid-Open Publication No. 2007-78427

According to the circuit shown in FIG. 1, since the current source 101 is used as a reference current source of the current mirror circuit, current i101 is supplied from the current source 101 to the PMOS transistor M103. Thus, in a condition where the current flowing through the switching transistor M101 is relatively low, it becomes necessary to make on resistance of the PMOS transistor M105 larger than that of the PMOS transistor M103, by making size of PMOS transistor M105 much smaller than that of the PMOS transistor M103, in order to make the current flowing through the PMOS transistors M107 and M109 smaller than the current flowing through the PMOS transistors M106 and M108, and to make the drain voltage of the PMOS transistor M105 lower than the drain voltage of the PMOS transistor M103.

As the current flowing through the switching transistor M101 increases and the drain voltage of the PMOS transistor M103 decreases, a gate voltage of the PMOS transistor M106 decreases because a gate-source voltage of the PMOS transistor M106 is unchanged. Since the gate of the PMOS transistor M107 is connected to the gate of the PMOS transistor M106, a gate voltage of the PMOS transistor M107 decreases and current flowing through the PMOS transistors M107 and M109 increases.

Since the drain voltage of the PMOS transistor M105 decreases with the increase of the current flowing through the PMOS transistors M107 and M109, a fluctuation of the gate-source voltage of the PMOS transistor M107 is small and an increasing rate of the current flowing through the PMOS transistors M107 and M109 is slow. Thus, a gain of the current mirror circuit when used as a comparator may be lowered. Then an accuracy of sensed current may be lowered and response speed may become slow.

Further, current level for sensing may be fluctuated because of an influence of sensing delay time of a current sensing circuit, when an input voltage is fluctuated or an output voltage is changed.

SUMMARY OF THE INVENTION

It is a general object of the present invention to provide a current sensing circuit and a switching regulator including the same that provide high accuracy of current sensing and high response speed.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a current sensing circuit and a switching regulator including the same particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a current sensing circuit configured to sense current flowing through a switching transistor of a non-insulated switching regulator, wherein the non-insulated switching regulator includes: the switching transistor being configured to perform switching in accordance with a first control signal input to a control terminal and to supply current supplied from a power input terminal to an inductor, and a rectifier element being configured to carry current supplied from the inductor when the switching transistor is turned off, and wherein the non-insulated switching regulator is configured to convert the input voltage to a predetermined constant voltage and to output the predetermined constant voltage as an output voltage from an output terminal, the current sensing circuit, including: a voltage divider circuit portion configured to divide and output a voltage across the switching transistor; a first transistor including a first current input terminal and a first output terminal, wherein the first current input terminal is connected to an output terminal of the voltage divider circuit portion, and wherein a predetermined first load is connected between the first current output terminal and the ground; a first impedance element including first and second ends, wherein the first end is connected to the power input terminal and configured to be supplied with input voltage from the power input terminal, and wherein an impedance of the first impedance element varies in accordance with a second control signal; a second transistor including a second current input terminal and a second current output terminal, wherein the second current input terminal is connected to the second end of the first impedance element, and wherein a predetermined second load is connected between the second current output terminal and the ground; a third transistor including a third current input terminal and a third current output terminal, wherein the third current input terminal is connected to the second end of the first impedance element, and wherein a first constant current source is connected between the third current output terminal and the ground; and a first voltage comparing circuit portion configured to compare a voltage at a connecting portion between the first transistor and the predetermined first load and a voltage at a connecting portion between the second transistor and the predetermined second load, and to output a signal indicating a comparison result of currents flowing through the switching transistor, wherein control terminals of the first transistor, the second transistor, and the third transistor are connected to each other and a connecting portion of the control terminals is connected to a connecting portion between the third transistor and the first constant current source.

Another embodiment of the present invention provides a current sensing circuit configured to sense current flowing through a synchronous rectifier transistor of a non-insulated switching regulator, wherein the non-insulated switching regulator includes: a switching transistor being configured to perform switching in accordance with a first control signal input to a control terminal and to supply current supplied from a power input terminal to an inductor, and the synchronous rectifier transistor being configured to carry current supplied from the inductor when the switching transistor is turned off, and wherein the non-insulated switching regulator is configured to convert the input voltage to a predetermined constant voltage and to output the predetermined constant voltage as an output voltage from an output terminal, the current sensing circuit, including: a second impedance element including a first end and a second end, wherein the first end is connected to a connecting portion between the synchronous rectifier transistor and the inductor; a seventh transistor including a seventh current input terminal and a seventh current output terminal, wherein the seventh current output terminal is connected to the second end of the second impedance element, and wherein a predetermined third load is connected between the seventh current input terminal and the power input terminal; an eighth transistor including an eighth current input terminal and an eighth current output terminal, wherein the eighth current output terminal is connected to the ground, and wherein a predetermined fourth load is connected between the eighth current input terminal and the power input terminal; a ninth transistor including a ninth current output terminal and a ninth current input terminal, wherein the ninth current output terminal is connected to the ground, and wherein a second constant current source is connected between the ninth current input terminal and the power input terminal; and a second voltage comparing circuit portion configured to compare a voltage at a connecting portion between the seventh transistor and the predetermined third load and a voltage at a connecting portion between the eighth transistor and the predetermined fourth load, and to output a signal indicating a comparison result of currents flowing through the switching transistor, wherein control terminals of the seventh transistor, the eighth transistor, and the ninth transistor are connected to each other and the connecting portion of the control terminals is connected to a connecting portion between the ninth transistor and the second constant current source.

Other objects and further features of the present invention will be apparent from the following detailed description when read in conjunction with the accompanying drawings.

DESCRIPTION OF EMBODIMENTS

In the following, embodiments of the present invention will be described with reference to the accompanying drawings.

[First Embodiment]

Figure 2:
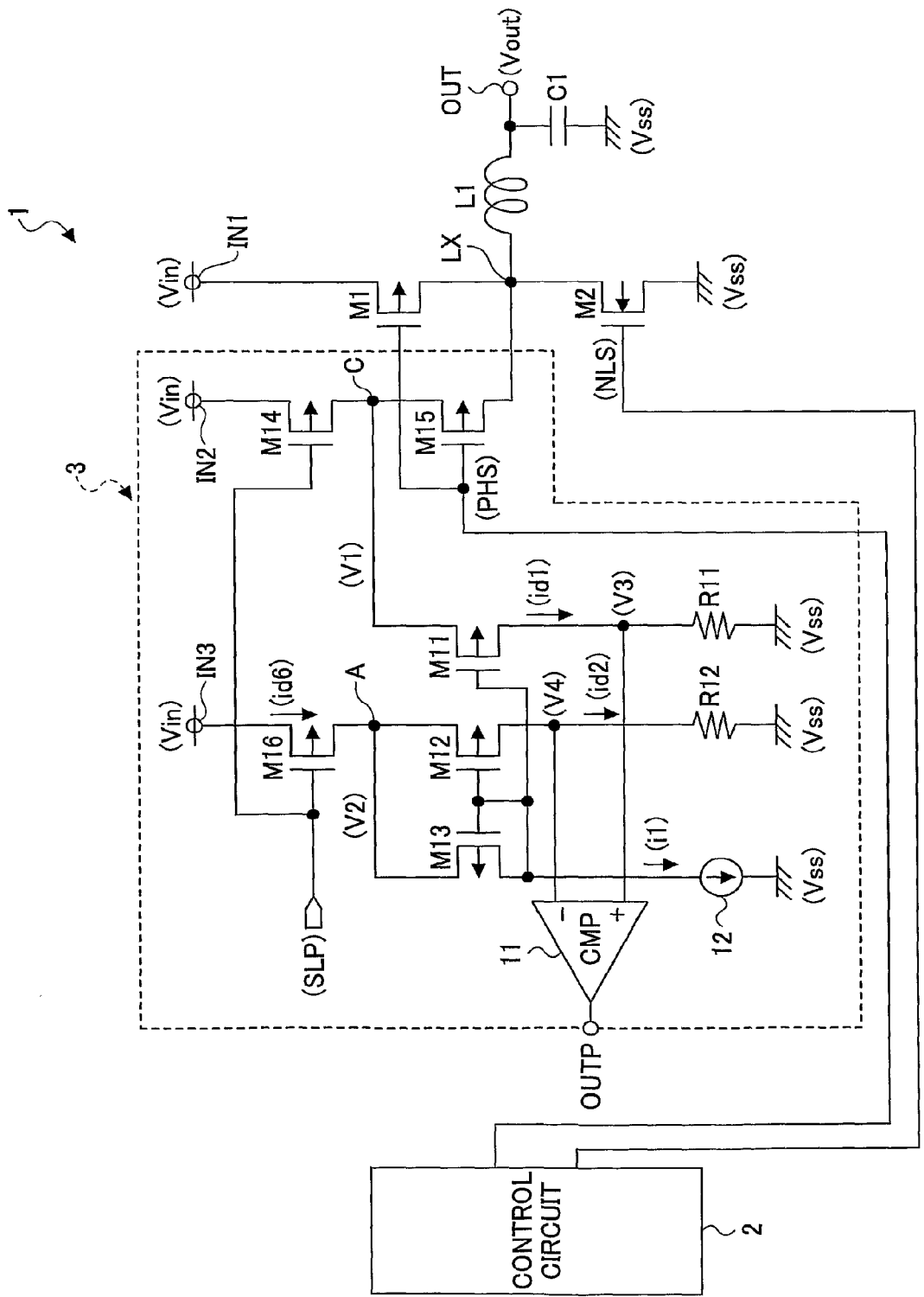
FIG. 2 is a schematic drawing showing a circuit of a switching regulator including a current sensing circuit according to a first embodiment.

FIG. 2 is a schematic drawing showing a circuit of a switching regulator including a current sensing circuit according to a first embodiment.

A switching regulator 1 shown in FIG. 2 is a synchronous rectifier type step down switching regulator. The switching regulator 1 converts an input voltage Vin input from a power input terminal IN1 into a predetermined constant voltage, and outputs the predetermined constant voltage from an output terminal OUT as an output voltage Vout.

The switching regulator 1 includes a switching transistor M1 formed of a PMOS transistor, and a synchronous rectifier transistor M2 formed of an NMOS transistor, and controls the output voltage by switching the switching transistor M1 and the synchronous rectifier transistor M2. The switching regulator 1 further includes a control circuit 2, a current sensing circuit 3, an inductor L1, and an output capacitor C1. The control circuit 2 controls switching of the switching transistor M1 and the synchronous rectifier transistor M2 in order to generate the output voltage Vout as the predetermined constant voltage. The current sensing circuit 3 senses current flowing through the switching transistor M1. The current sensing circuit 3 includes PMOS transistors M11~M16, a comparator 11, a constant current source 12 which outputs a predetermined constant current i1, and resistors R1, R2.

Herein, the synchronous rectifier transistor M2 constitutes a rectifier element, the PMOS transistor M11 constitutes a first transistor, the PMOS transistor M12 constitutes a second transistor, and the PMOS transistor M13 constitutes a third transistor. The resistor R11 constitutes a first load, the resistor R12 constitutes a second load, and the constant current source 12 constitutes a first constant current source. The PMOS transistors M14 and M15 form a voltage divider circuit, wherein the PMOS transistor M14 constitutes a fourth transistor, and the PMOS transistor M15 constitutes a fifth transistor. The PMOS transistor M16 constitutes a first impedance element and as a sixth transistor, and the comparator 11 constitutes a first voltage comparing circuit portion.

Herein, circuit elements included in the switching regulator 1, except for the inductor L1 and the capacitor C1, may be integrated as an IC. Alternatively, circuit elements included in the switching regulator 1, except for the switching transistor M1 and/or the synchronous rectifier transistor M2, the inductor L1, and the capacitor C1, may be integrated as an IC.

The switching transistor M1 and the synchronous rectifier transistor M2 are connected in series and inserted between a power input terminal IN1 and the ground Vss. The inductor L1 is inserted between a connecting portion LX, which connects the switching transistor M1 and the synchronous rectifier transistor M2, and the output terminal OUT. The capacitor C1 is inserted between the output terminal OUT and the ground Vss. Herein, for example, in a case that the switching regulator 1 performs PWM control, the control circuit 2, to which the output voltage Vout is input, amplifies a voltage difference between a divided voltage Vfb, which is divided from the output voltage Vout, and a predetermined reference voltage Vref. And then the control circuit 2 generates an error voltage Ve. The control circuit 2 outputs a control signal PHS, which is formed of a pulse signal generated by comparing the error voltage Ve and a voltage of a predetermined triangular wave signal TW, to a gate of the switching transistor M1. The control circuit 2 further outputs a control signal NLS, which is generated by inverting a signal level of the control signal PHS, to a gate of the synchronous rectifier transistor M2.

Figure 3:
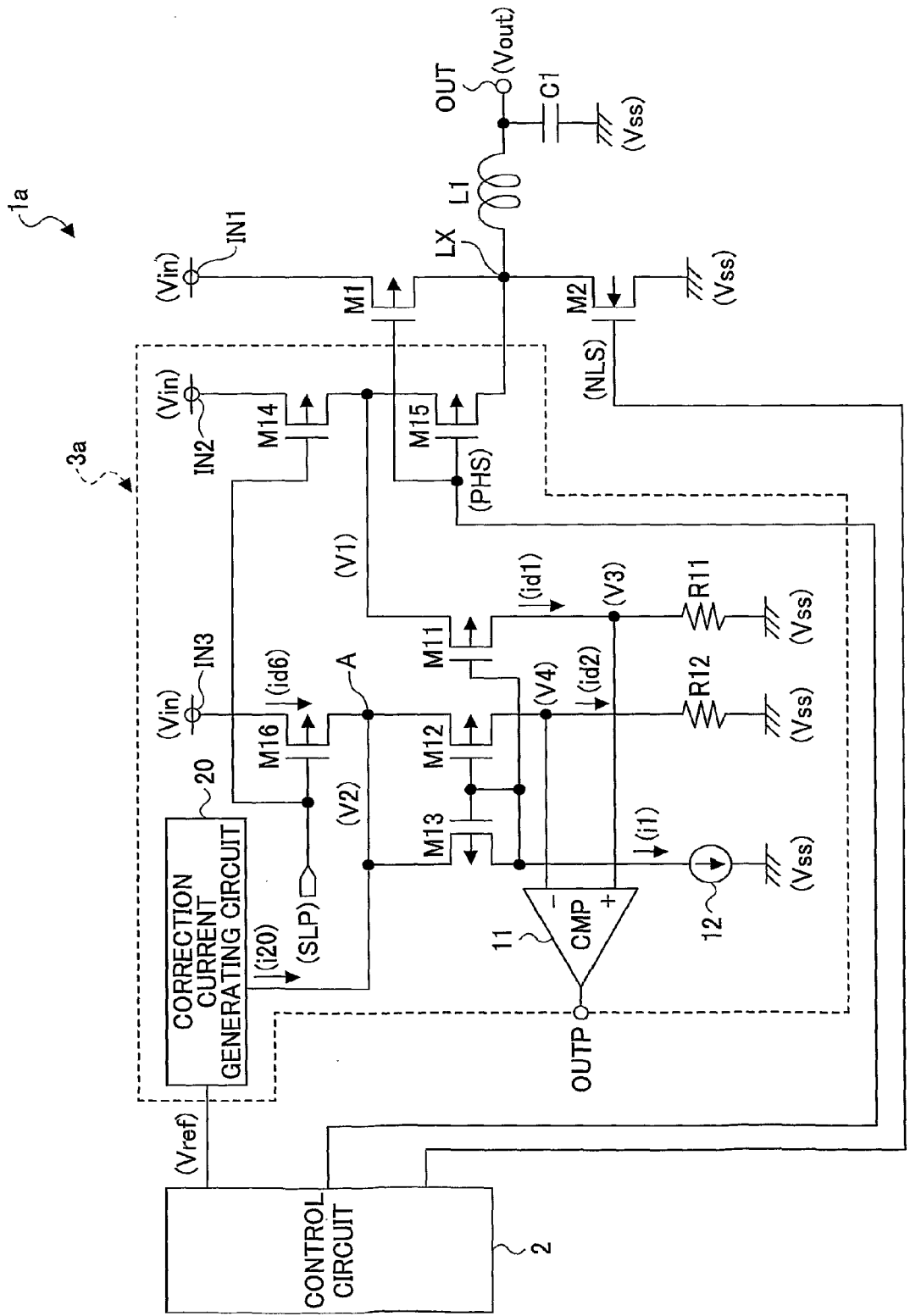
FIG. 3 is a schematic drawing showing a circuit of a switching regulator including a current sensing circuit according to a second embodiment.

The source of the PMOS transistor M16 is connected to the power input terminal IN3, and a drain of the PMOS transistor M16 is connected to the sources of the PMOS transistors M12 and M13. Hereinafter, a connecting portion among the PMOS transistor M16 and the PMOS transistors M12, M13 is referred to as A (FIGS. 2 and 3). The PMOS transistors M12 and M13 form a current mirror circuit, and the gates thereof are connected to each other. A connecting portion between the PMOS transistors M12 and M13 is connected to a drain of the PMOS transistor M13. A resistor R12 is inserted between a drain of the PMOS transistor M12 and the ground Vss, and a constant current source 12 is inserted between the drain of the PMOS transistor M13 and the ground Vss.

The PMOS transistors M14 and M15 are connected in series and inserted between the power input terminal IN2 and the connecting portion LX. The PMOS transistor M11 and the resistor R11 are connected in series and inserted between a connecting portion C and the ground Vss. The connecting portion C connects the PMOS transistor M14 to the PMOS transistor M15. A control signal SLP is input to each gate of the PMOS transistors M14 and M16 from a power source outside the switching regulator 1. A gate of the PMOS transistor M11 is connected to the gate of the PMOS transistor M13. The control signal PHS is input to a gate of the PMOS transistor M15. A non-inverting input terminal of the comparator 11 is connected to a connecting portion between the PMOS transistor M11 and the resistor R11. An inverting input terminal of the comparator 11 is connected to a connecting portion between the PMOS transistor M12 and the resistor R12. An output terminal of the comparator 11 is connected to an output terminal OUTP of the current sensing circuit 3.

In such a circuit configuration described above, in a case that the switching regulator 1 performs PWM control, the duty cycle of the control signal PHS becomes lower as the output voltage Vout becomes higher. The lower duty cycle of the control signal PHS shortens the turn-on period of the switching transistor M1 and correspondingly lengthens the turn-on period of the synchronous rectifier transistor M2. In this case, the control circuit 2 controls the switching regulator controls to step down. On the other hand, the duty cycle of the control signal PHS becomes higher as the output voltage Vout becomes lower. The higher duty cycle of the control signal PHS lengthens the turn-on period of the switching transistor M1 and correspondingly shortens the turn-on period of the synchronous rectifier transistor M2. In this case, the control circuit 2 controls the switching regulator controls to step up. The control circuit 2 controls the duty cycle of the switching transistor M1 and the synchronous rectifier transistor M2 so that the predetermined constant voltage is output from the output terminal as the output voltage Vout in a manner as described above.

Because the control signal SLP input from the power source outside the switching regulator 1 is in a low level when the switching regulator 1 is being activated, the PMOS transistors M14 and M16 are turned on while the switching regulator 1 is being activated. Since the gate of the PMOS transistor M15 is connected to the gate of the switching transistor M1, the PMOS transistor M15 is turned on/off in synchronization with the switching transistor M1. Thus, the PMOS transistor M15 is turned on while the switching transistor M1 is turned on, and which causes current to flow through the PMOS transistors M14 and M15. The larger the source-drain voltage of the switching transistor M1 becomes, the larger the current becomes. The PMOS transistors M14 and M15 form the voltage divider circuit which divides the source-drain voltage and outputs a voltage V1 from the drain of the PMOS transistor M14.

Because the PMOS transistors M12 and M13 are in the form of a current mirror circuit, the drain current id2 of the PMOS transistor M12 becomes a constant current, the amount of which is proportional to the amount of the constant current supplied from the constant current source 12.

A drain current id6 becomes a constant current, the amount of which is the sum of the drain currents i1 and id2 of the respective PMOS transistors M12 and M13. The value of a drain voltage V2 of the PMOS transistor M16 is determined by the current id6.

The current flowing through the switching transistor M1 becomes minimum just after turning on the switching transistor M1, and then linearly increases with time. An increasing rate thereof depends on a voltage difference between the input voltage Vin and the output voltage Vout. The larger the voltage difference becomes, the higher the increasing rate becomes.

In a case where after the switching transistor M1 is turned on, and the current of the switching transistor M1 is still relatively small, a voltage drop due to the switching transistor M1 becomes relatively small. The drain voltage V1 of the PMOS transistor M14 becomes larger than the drain voltage V2 of the PMOS transistor M16. A gate-source voltage of the PMOS transistor M11 becomes larger than a gate-source voltage of the PMOS transistor M12, and drain current id1 becomes larger. Then, a voltage drop due to the resistor R11 becomes larger, and a drain voltage V3 of the PMOS transistor M11 becomes larger than the drain voltage V4 of the PMOS transistor M12, and the comparator 11 outputs a high level signal.

As the current of the switching transistor M1 increases, the voltage drop due to the switching transistor M1 becomes larger, and the current flowing through the PMOS transistors M14 and M15 increases. Thus, the drain voltage V1 of the PMOS transistor M14 decreases. When the drain voltage V1 of the PMOS transistor M14 decreases, the gate-source voltage of the PMOS transistor M11 decreases, because the gate voltage of the PMOS transistor M11 is fixed to the gate voltage of the PMOS transistor M13. As a result, the drain current id1 of the PMOS transistor M11 becomes smaller, and thus the voltage drop due to the resistor R11 becomes smaller. The output signal of the comparator 11 is inverted into low level when the drain voltage V3 of the PMOS transistor M11 becomes lower than or equal to the drain voltage V4 of the PMOS transistor M12. Thus, the output signal is output as a signal which indicates that the current of the switching transistor M1 reaches a predetermined value for sensing.

As described above, according to the current sensing circuit of the first embodiment, the drain voltage V2 of the PMOS transistor M16 stays substantially constant while the current of the switching transistor M1 is being sensed, and thus each gate voltage of the PMOS transistors M11~M13 stays substantially constant. It then becomes possible to provide the current sensing circuit 3, which senses the current flowing through the switching transistor M1, with high sensitivity and high response speed, without losing a gain thereof.

Further, as described above, the conductivity type of the PMOS transistors M14 and M15 is configured to be the same conductivity type as that of the switching transistor M1. Thus, on resistance of the PMOS transistors M14 and M15 varies in accordance with the variation of on resistance of the switching transistor M1, even if a variation occurs in the manufacturing process. As a result, the ratio of the current flowing through the switching transistor M1 and the current flowing through the PMOS transistors M14, M15 is kept constant, and consequently the ratio of divided voltage between the PMOS transistors M14 and M15 is kept constant. It then becomes possible to sense the current with high accuracy, even if a variation occurs in the manufacturing process.

As described above, since the conductivity type of the PMOS transistor M16 formed of a first impedance element is configured to be the same conductivity type as that of the PMOS transistor M14, a ratio of divided voltage of the PMOS transistors M14 and M16 is kept constant, even if a variation occurs in the manufacturing process. Thus, it becomes possible to sense the current with high accuracy.

[Second Embodiment]

According to the first embodiment, the increasing rate of the current flowing through the switching transistor M1 varies in response to the voltage difference between the input voltage Vin and the output voltage Vout. Thus, current value of the switching transistor M1 at a point in time when a sensing signal is output from the output terminal OUTP varies in response to the voltage difference between the input voltage Vin and the output voltage Vout because of the sensing delay time, in a case that current level for sensing is kept constant. Particularly, according to a switching regulator configured to variably set the output voltage Vout, the voltage difference between the input voltage Vin and the output voltage Vout varies largely, thus the sensing delay time increases to a non negligible value. A second embodiment provides a current sensing circuit, and a switching regulator including the same, configured to keep the current value of the switching transistor M1 at the point in time when the sensing signal, which indicates that the current value of the current flowing through the switching transistor M1 reaches a predetermined value, is output from the output terminal OUTP, by use of a correction current generating circuit 20, in spite of the variation of the voltage difference between the input voltage Vin and the output voltage Vout.

Figure 1:
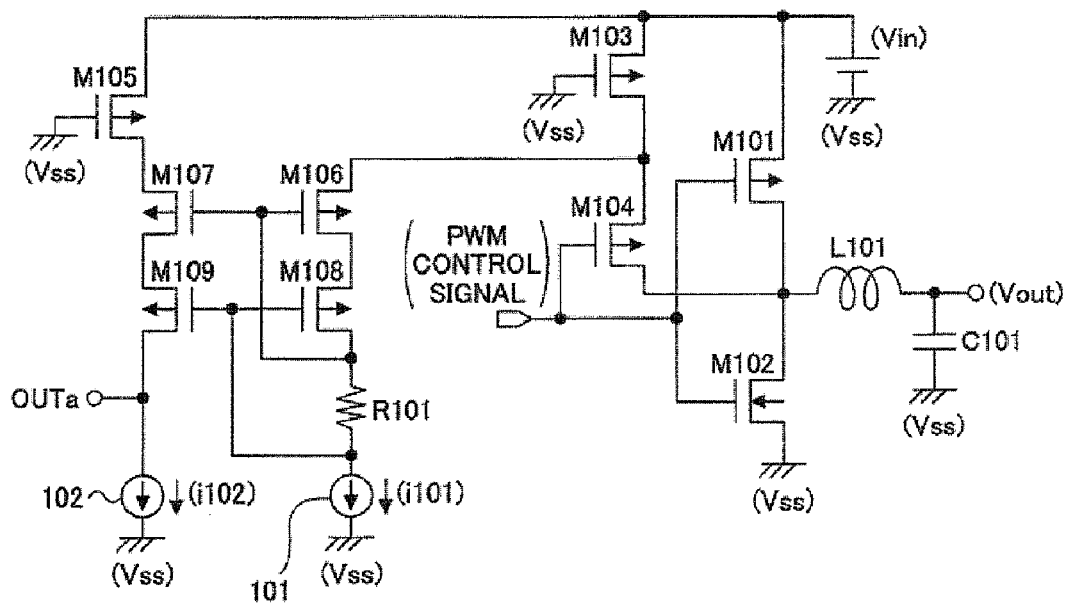
FIG. 1 shows a schematic drawing showing a conventional circuit for sensing current.

FIG. 3 is a schematic drawing showing a circuit of a switching regulator including a current sensing circuit according to a second embodiment. In FIG. 2, the same elements as or similar elements to those of FIG. 1 are referred to by the same reference numerals, and a description thereof is omitted.

The difference between FIG. 3 and FIG. 2 is the correction current generating circuit 20. Herein, reference numeral of a current sensing circuit indicated as the current sensing circuit 3 in FIG. 2 is changed to 3a, and reference numeral of a switching regulator indicated as the switching regulator 1 in FIG. 2 is changed to 1a.

As shown in FIG. 3, the switching regulator 1a is a synchronous rectifier type step down switching regulator. The switching regulator 1a converts the input voltage Vin input from the power input terminal IN1 into a predetermined constant voltage, and outputs the predetermined constant voltage from the output terminal OUT as an output voltage Vout.

The switching regulator 1a includes the switching transistor M1, a synchronous rectifier transistor M2, a control circuit 2, a current sensing circuit 3a, an inductor L1, and a output capacitor C1. The current sensing circuit 3a includes PMOS transistors M11~M16, a comparator 11, a constant current source 12, resistors R1, R2, and a correction current generating circuit 20. The correction current generating circuit 20 generates correction current i20 and adds the correction current i20 to a drain current id6 of the PMOS transistor M16. Herein, the correction current generating circuit 20 is constitutes a first correction current generating circuit portion configured to output the current i20 as first correction current.

The current value of the switching transistor M1 varies during the sensing delay time from the point in time when the current value reaches the predetermined value for sensing to the point in time when the sensing signal is output from the output terminal OUTP. Adding the current i20 output from the correction current generating circuit 20 to the current id6 output from the PMOS transistor M16 maintains the current value of the switching transistor M1 substantially constant.

Figure 4:
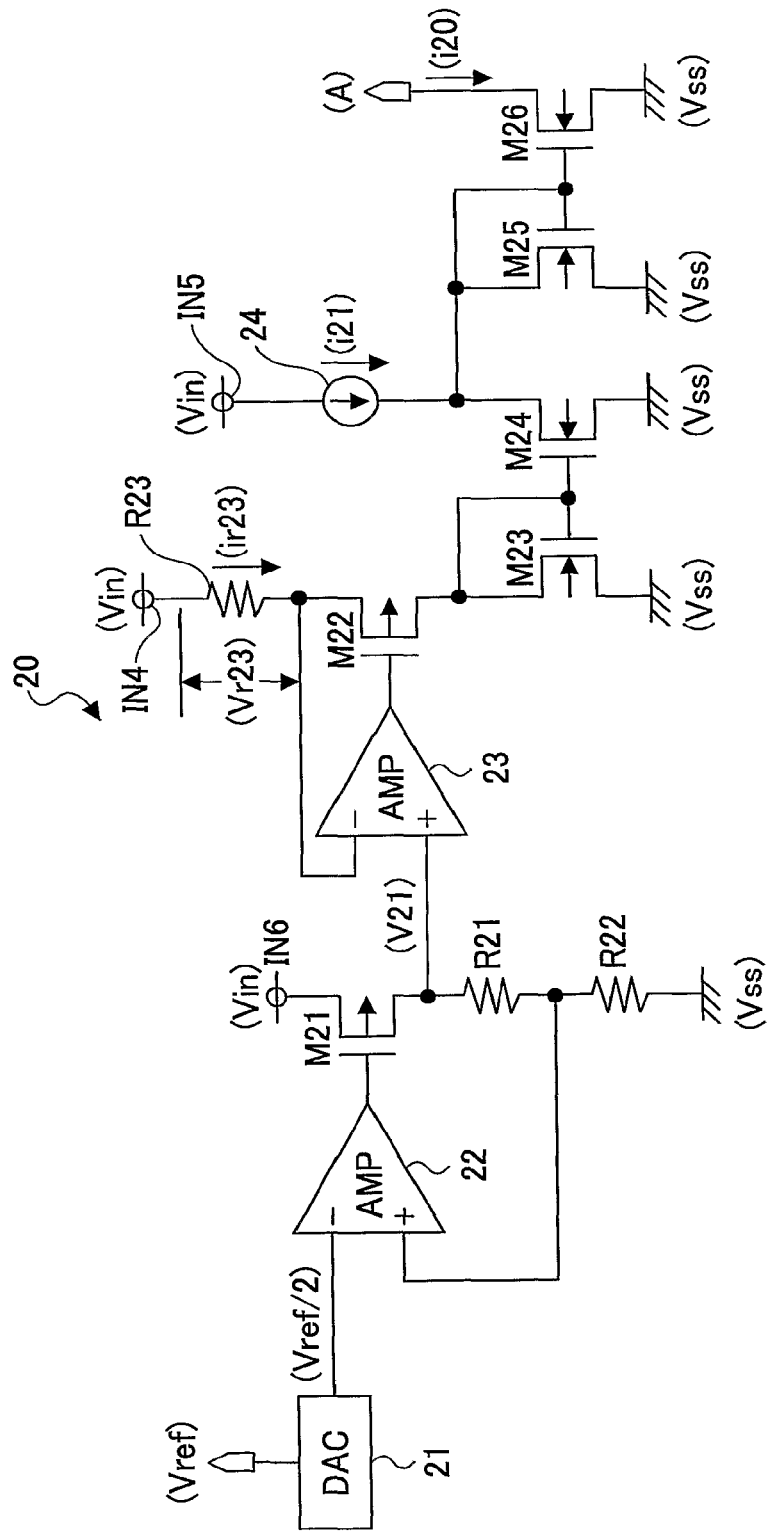
FIG. 4 is a schematic drawing showing a representative circuit configuration of the correction current generating circuit 20 according to the second embodiment.

FIG. 4 is a schematic drawing showing a representative circuit configuration of the correction current generating circuit 20 according to the second embodiment. In the following, an operation of the correction current generating circuit 20 will be described in detail with reference to FIG. 4.

As shown in FIG. 4, the correction current generating circuit 20 includes a D/A converter 21, operational amplifier circuits 22, 23, a constant current source 24, PMOS transistors M21, M22, NMOS transistors M23~M26, and resistors R21~R23.

The D/A converter 21 outputs a reference voltage Vref supplied to the control circuit 2 and a half voltage Vref/2 respectively. The half voltage Vref/2 is input to an inverting input terminal of the operational amplifier circuit 22. An output terminal of the operational amplifier circuit 22 is connected to a gate of the PMOS transistor M21. A source of the PMOS transistor M21 is connected to the power input terminal IN6, and the resistors R21 and R22 are connected in series and inserted between a drain of the PMOS transistor M21 and the ground Vss. A non-inverting input terminal of the operational amplifier circuit 22 is connected to a connecting portion between resistors R21 and R22, and a connecting portion between the PMOS transistor M21 and the resistor R21 is connected to a non-inverting input terminal of the operational amplifier circuit 23.

An output terminal of the operational amplifier circuit 23 is connected to a gate of the PMOS transistor M22, and the resistor R23 is inserted between the power input terminal IN4 and a source of the PMOS transistor M22. A connecting portion between the resistor R23 and the PMOS transistor M22 is connected to an inverting input terminal of the operational amplifier circuit 23. The NMOS transistors M23 and M24 form a current mirror circuit, and each source of the NMOS transistors M23 and M24 is connected to the ground Vss. Gates of the NMOS transistors M23 and M24 are connected to each other, and a connecting portion therebetween is connected to a drain of the NMOS transistor M23. The drain of the NMOS transistor M23 is connected to the drain of the PMOS transistor M22. The constant current source 24 is inserted between the power input terminal IN5 and a drain of the NMOS transistor M24.

The NMOS transistors M25 and M26 form a current mirror circuit. Each of sources of the NMOS transistors M25 and M26 is connected to the ground Vss, and gates of the NMOS transistors M25 and M26 are connected to each other. A connecting portion between the gates is connected to a drain of the NMOS transistor M25. The drain of the NMOS transistor M25 is connected to a connecting portion between the constant current source 24 and the NMOS transistor M24. A drain of the NMOS transistor M26 is connected to a connecting portion A shown in FIG. 4 and forms an output terminal of the correction current generating circuit 20. The correction current i20 is supplied from the drain of the NMOS transistor M26.

In such a circuit configuration described above, the D/A converter 21 generates the reference voltage Vref in accordance with a command from outside the correction current generating circuit 20, and generates the half voltage Vref/2 in proportion to the reference voltage Vref. The output voltage Vout of the switching regulator 1a shown in FIG. 3 is varied in accordance with the half voltage Vref/2 which is varied in proportion to the reference voltage Vref determined by the command from outside the correction current generating circuit 20. Thus, the output voltage Vout is determined based on the half voltage Vref/2.

The D/A converter 21, the operational amplifier circuit 22, the PMOS transistor M21, and the resistors R21, R22 form a constant voltage circuit. The drain of the PMOS transistor M21 forms an output terminal of the constant voltage circuit. A voltage V21 of the output terminal is expressed in a formula (1) as shown below.

$$V21 = Vref/2 * (r21+r22)/r21 \quad (1)$$

As shown in the formula (1), the voltage V21 is expressed as a function of the half voltage Vref/2, i.e. the voltage V21 is treated as a function of the output voltage Vout. The voltage V21 is input to the non-inverting input terminal of the operational amplifier circuit 23.

The operational amplifier circuit 23 controls a gate voltage of the PMOS transistor M22 so that a source voltage of the PMOS transistor M22 becomes equal to the voltage V21 input to the non-inverting input terminal of the operational amplifier circuit 23. From this point of view, a voltage Vr23 across the resistor R23 is expressed in a formula (2) as shown below.

$$Vr23 = Vin - V21 \quad (2)$$

Further, current ir23 flowing through the resistor R23 is expressed in a formula (3) as shown below.

$$ir23 = Vr23/r23 \quad (3)$$

As shown in the formulas (1)~(3), the current ir23 is treated as a function of the input voltage Vin and the output voltage Vout. The current ir23 is supplied to the drain of the NMOS transistor M23 via the PMOS transistor M22.

As described above, the NMOS transistors M23 and M24 form the current mirror circuit. Drain current id24 of the NMOS transistor M24 is expressed in a formula (4) as shown below, wherein a size ratio of the NMOS transistors M23 and M24 is expressed as 1 : K1.

$$id24 = K1 * ir23 \quad (4)$$

Since the constant current i21 is supplied to each drain of the NMOS transistors M24 and M25 from the constant current source 24, drain current id25 of the NMOS transistor M25 is expressed in a formula (5) shown below.

$$id25 = i21 - id24 \quad (5)$$

As described above, the NMOS transistors M25 and M26 form the current mirror circuit. Drain current id26, i.e. the correction current i20, of the NMOS transistor M26 is expressed in a formula (6) as shown below, wherein a size ratio of the NMOS transistors M25 and M26 is expressed as 1: K2.

$$i20 = K2 * id25 \quad (6)$$

The drain current id25 expressed in the formula (6) is treated as a function of the input voltage Vin and the output voltage Vout. Thus, the correction current i20 is treated as a function of the input voltage Vin and the output voltage Vout. The correction current i20 becomes larger when the voltage difference between the input voltage Vin and the output voltage Vout becomes smaller, and the correction current i20 becomes smaller when the voltage difference between the input voltage Vin and the output voltage Vout becomes larger. Herein, the maximum value of the correction current i20 is restricted by a constant current i21 supplied from the constant current source 24.

The voltage V2, which is equal to the drain voltage of the PMOS transistor M16, decreases by a voltage portion corresponding to the correction current i20 when the correction current i20 is added to the drain current id6. Thus, the current level for sensing the current flowing through the switching transistor M1 becomes larger, and an even larger current becomes necessary for the comparator 11 to output a low level signal which indicates that the current flowing through the switching transistor M1 reaches the predetermined value for sensing.

The larger the current gradient of the current flowing through the switching transistor M1 becomes, the smaller the correction current i20 becomes. Thus, it becomes possible to sense the current flowing through the switching transistor M1 with the smaller correction current i20, as the current gradient of the current flowing through the switching transistor M1 becomes larger. On the other hand, the smaller the current gradient of the current flowing through the switching transistor M1 becomes, the larger the correction current i20 becomes. Thus, the larger correction current i20 becomes necessary to sense the current flowing through the switching transistor M1. In this case, it is possible to keep the current value of the switching transistor M1 at the point in time when the sensing signal is output from the output terminal OUTP substantially constant by setting current the value of the correction current i20 to an appropriate value, in spite of the voltage difference between the input voltage Vin and the output voltage Vout.

According to the current sensing circuit of the second embodiment, the same advantageous effect as that of the current sensing circuit of the first embodiment can be obtained. Further, the current sensing circuit of the second embodiment can keep the current value of the switching transistor M1 at the point in time when the sensing signal is output from the output terminal OUTP substantially constant by use of the correction current generating circuit 20, in spite of the voltage difference between the input voltage Vin and the output voltage Vout. Thus, the current sensing circuit can sense the current of the switching transistor M1 with higher accuracy.

According to the second embodiment described above, the half voltage Vref/2 is input to the inverting input terminal of the operational amplifier circuit 22. The second embodiment is intended as illustrative only, and the voltage input to the inverting input terminal of the operational amplifier circuits 22 can be achieved at any value as long as the voltage is proportional to the output voltage Vout. For example, the voltage may be set to a voltage obtained by dividing the output voltage Vout with a voltage dividing resistor.

The voltage 21 may be set to, for example, any voltage as long as it is proportional to the output voltage Vout.

[Third Embodiment]

According to the first and second embodiments, the current sensing circuit senses the current flowing through the switching transistor M1. The current sensing circuit of the third embodiment senses current flowing through the synchronous rectifier transistor M2.

Figure 5:
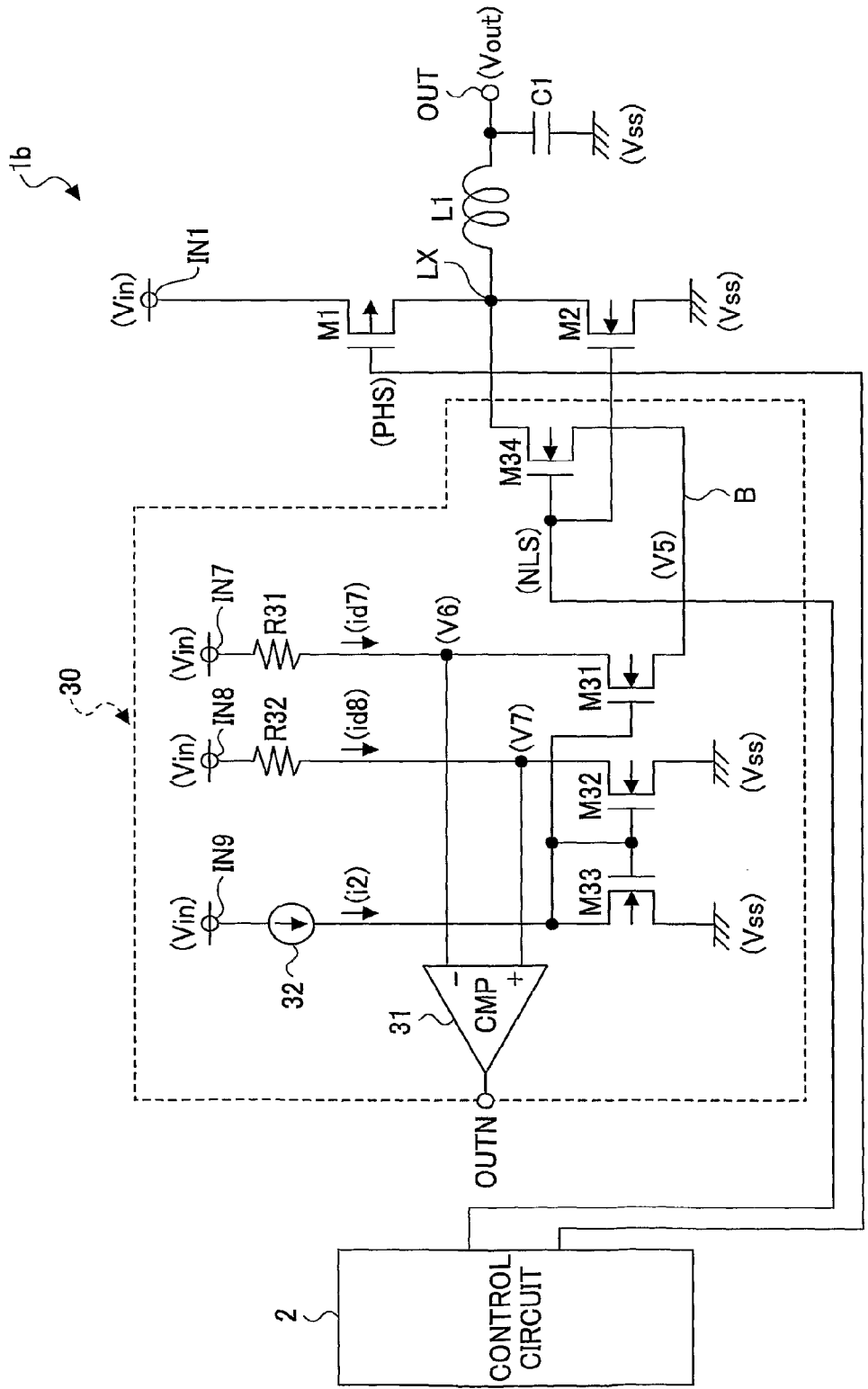
FIG. 5 is a schematic drawing showing a circuit of a switching regulator including a current sensing circuit according to a third embodiment.

FIG. 5 is a schematic drawing showing a circuit of a switching regulator including a current sensing circuit according to a third embodiment. In FIG. 4, the same elements as or similar elements to those of FIG. 1 are referred to by the same reference numerals, and a description thereof is omitted.

The difference between FIG. 5 and FIG. 2 is the current sensing circuit 30 and the current sensing circuit 3. In the third embodiment, the current sensing circuit 3 is replaced by the current sensing circuit 30 which senses the current flowing through the synchronous rectifier transistor M2. Herein, the reference numeral of a switching regulator indicated as the switching regulator 1 in FIG. 2 is changed to 1b.

As shown in FIG. 5, a switching regulator 1b is a synchronous rectifier type step down switching regulator. The switching regulator 1b converts an input voltage Vin input from an power input terminal IN1 into a predetermined constant voltage, and outputs the predetermined constant voltage from an output terminal OUT as an output voltage Vout.

The switching regulator 1b includes a switching transistor M1, a synchronous rectifier transistor M2, a control circuit 2, a current sensing circuit 30 which senses the current flowing through the synchronous rectifier transistor M2, an inductor L1, and an output capacitor C1. The current sensing circuit 30 includes NMOS transistors M31~M34, a comparator 31, a constant current source 32 which outputs a predetermined constant current i2, and resistors R1, R2.

The NMOS transistor M31 constitutes a seventh transistor, the NMOS transistor M32 constitutes an eighth transistor, and the NMOS transistor M33 constitutes a ninth transistor. The resistor R31 constitutes a third load, the resistor R32 constitutes a fourth load, and the constant current source 32 constitutes a second constant current source. The NMOS transistor M34 constitutes a second impedance element and as a tenth transistor, and the comparator 31 constitutes a second voltage comparing circuit portion. Herein, the circuit elements included in the switching regulator 1b, except for the inductor L1 and the capacitor C1, may be integrated as an IC. Alternatively, the circuit elements included in the switching regulator 1b, except for the switching transistor M1 and/or the synchronous rectifier transistor M2, the inductor L1, and the capacitor C1, may be integrated as an IC.

The NMOS transistors M32 and M33 form a current mirror circuit. Each source of the NMOS transistors M32 and M33 is connected to the ground Vss. Gates of the NMOS transistors M32 and M33 are connected to each other, and a connecting portion between the gates is connected to a drain of the NMOS transistor M33. The constant current source 32 is inserted between the power input terminal IN9 and a drain of the NMOS transistor M33, and the resistor R32 is inserted between the power input terminal IN8 and a drain of the NMOS transistor M32.

The resistor 31, and the NMOS transistors M31, M34 are connected in series and inserted between the power input terminal IN7 and the connecting portion LX. A gate of the NMOS transistor M31 is connected to the gate of the NMOS transistor M33. A control signal NLS is input to the gate of the NMOS transistor M34. A non-inverting input terminal of the comparator 31 is connected to a connecting portion between the resistor R32 and the NMOS transistor M32, and an inverting input terminal of the comparator 31 is connected to a connecting portion between the resistor R31 and the NMOS transistor M31. An output terminal of the comparator 31 is connected to an output terminal OUTN of the current sensing circuit 30.

In such a circuit configuration described above, since the gate of the NMOS transistor M34 is connected to the gate of the synchronous rectifier transistor M2, the NMOS transistor M34 is turned on/off in synchronization with the synchronous rectifier transistor M2. Thus, the NMOS transistor M34 is being turned on while the synchronous rectifier transistor M2 is being turned on. Since, as described above, the NMOS transistors M32 and M33 form a current mirror circuit, a drain current id8 of the NMOS transistor M32 becomes a current which is proportional to the current i2 supplied from the constant current source 32. Since the drain current id8 is supplied to the resistor R32, a voltage drop due to the resistor R21 is kept constant, and a voltage V7 which is formed by the drain voltage of the NMOS transistor M32 becomes constant.

Since the gate voltage of the NMOS transistor M31 is the same as the gate voltage of the NMOS transistors M32 and M33, a gate-source voltage of the NMOS transistor M31 is expressed by subtracting a drain-source voltage of the NMOS transistor M34 from a voltage difference between the gate voltages of the NMOS transistors M32, M33 and a voltage of the connecting portion LX.

Current flowing through the synchronous rectifier transistor M2 starts to decrease substantially linearly when the synchronous rectifier transistor M2 is turned on. The larger the output voltage Vout becomes, the larger the decreasing rate of the current of the synchronous rectifier transistor M2 becomes.

In a case where after the synchronous rectifier transistor M2 is turned on, and a large amount of current is flowing through the synchronous rectifier transistor M2, a voltage drop due to the synchronous rectifier transistor M2 becomes larger, and the voltage of the connecting portion LX decreases below zero. And then a source voltage formed of a voltage V5 of a connecting portion B decreases in accordance with the voltage decrease of the connecting portion LX. Thus, the gate-source voltage of the NMOS transistor M31 increases, and drain current id7 of the NMOS transistor M31 increases. Further, a voltage drop due to the resistor R3 becomes larger, and a voltage V6 formed of the drain voltage of the NMOS transistor M31 becomes smaller than a voltage V7 formed of the drain voltage of the NMOS transistor M32. As a result, the output signal of the comparator 31 reaches a high level.

As the current of the synchronous rectifier transistor M2 decreases, the voltage drop due to the synchronous rectifier transistor M2 becomes smaller. This causes the source voltage V5 of the NMOS transistor to increase, and the drain current id7 of the NMOS transistor M31 to decrease. When the drain voltage V6 of the NMOS transistor M31 increases and becomes larger than the drain voltage V7 of the NMOS transistor M32, an output signal of the comparator 31 is inverted into low level and output as a signal which indicates that the current of the synchronous rectifier transistor M2 has reached a predetermined value for sensing.

As described above, according to the current sensing circuit of the third embodiment, the gate voltage of the NMOS transistor M31 stays substantially constant while the current of the synchronous rectifier transistor M2 is being sensed. It then becomes possible to provide the current sensing circuit 30 which senses the current flowing through the synchronous rectifier transistor M2 with high sensitivity and high response speed, without losing a gain of the NMOS transistor M31.

Further, as described above, the conductivity type of the NMOS transistor M34 is configured to be the same as the conductivity type as that of the synchronous rectifier transistor M2. It then becomes possible to sense the current with high accuracy, even if a variation occurs in the manufacturing process.

[Fourth Embodiment]

According to the third embodiment, the current flowing through the synchronous rectifier transistor M2 starts to decrease substantially linearly when the synchronous rectifier transistor M2 is turned on. The larger the output voltage Vout becomes, the higher the decreasing rate of the current flowing through the synchronous rectifier transistor M2 becomes. Thus, the current value of the synchronous rectifier transistor M2 at a point in time when a sensing signal is output from the output terminal OUTN varies in response to the voltage value of the output voltage Vout because of the sensing delay time, in a case that current level for sensing the current of the synchronous rectifier transistor M2 is kept constant. In particular, the larger the output voltage Vout becomes, the smaller the sensed current becomes. The smaller the output voltage Vout becomes, the larger the sensed current becomes. A fourth embodiment provides a current sensing circuit, and a switching regulator including the same, configured to keep the current value of the synchronous rectifier transistor M2 at the point in time when the sensing signal, which indicates that the current value of the current flowing through the synchronous rectifier transistor M2 reaches the predetermined value, is output from the output terminal OUTN, by use of a correction current generating circuit 20, in spite of the voltage variation of the output voltage Vout.

Figure 6:
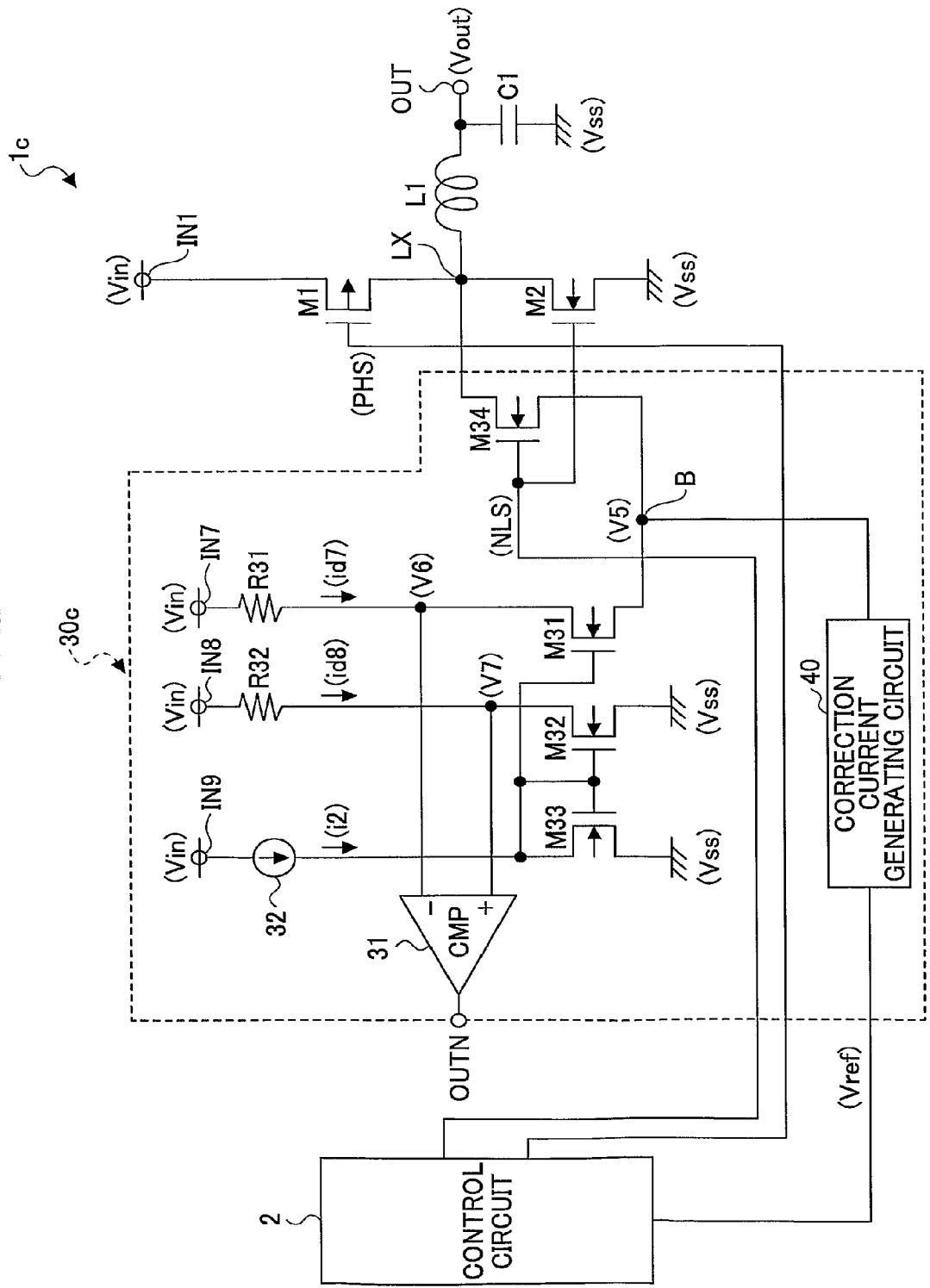
FIG. 6 is a schematic drawing showing a circuit of a switching regulator including a current sensing circuit according to a fourth embodiment.

FIG. 6 is a schematic drawing showing a circuit of a switching regulator including a current sensing circuit according to a fourth embodiment. In FIG. 5, the same elements as or similar elements to those of FIG. 4 are referred to by the same reference numerals, and a description thereof is omitted.

The difference between FIG. 6 and FIG. 5 is the correction current generating circuit 40 added into the current sensing circuit 30c. Herein, reference numeral of a current sensing circuit indicated as the current sensing circuit 30 in FIG. 5 is changed to 30c, and reference numeral of a switching regulator indicated as the switching regulator 1b in FIG. 5 is changed to 1c.

As shown in FIG. 6, the switching regulator 1c is a synchronous rectifier type step down switching regulator. The switching regulator 1c converts the input voltage Vin input from the power input terminal IN1 into a predetermined constant voltage, and outputs the predetermined constant voltage from the output terminal OUT as an output voltage Vout.

The switching regulator 1c includes a switching transistor M1, a synchronous rectifier transistor M2, a control circuit 2, a current sensing circuit 30c, an inductor L1, and an output capacitor C1. The current sensing circuit 30c includes NMOS transistors M31~M34, a comparator 31, a constant current source 32, resistors R31, R32, and a correction current generating circuit 40. The correction current generating circuit 40 generates a correction current i40 and adds the correction current i40 to current flowing in a connecting portion B. The correction current generating circuit 40 constitutes a second correction current generating circuit portion configured to output the current i40 as second correction current.

The synchronous rectifier transistor M2 varies during the sensing delay time from the point in time when the current value reaches the predetermined value for sensing to the point in time when the sensing signal is output from the output terminal OUTN. Adding the current i40 output from the correction current generating circuit 40 to the current flowing in a connecting portion B maintains the current value of the synchronous rectifier transistor M2 substantially constant. Thus a variation of the current of the synchronous rectifier transistor M2 due to the sensing delay time is corrected in spite of the variation of the output voltage Vout.

Figure 7:
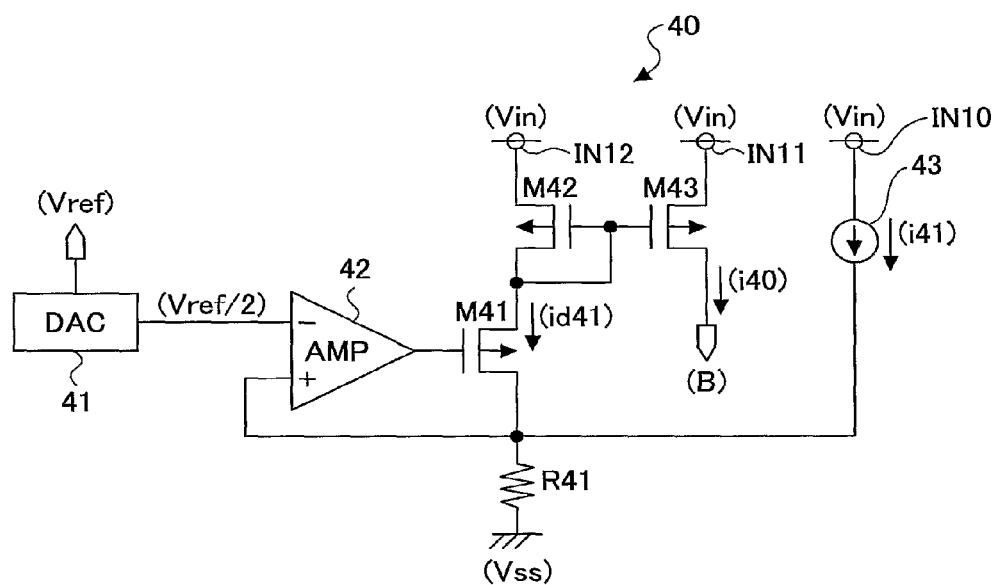
FIG. 7 is a schematic drawing showing a representative circuit configuration of the correction current generating circuit 40 according to the fourth embodiment.

FIG. 7 is a schematic drawing showing a representative circuit configuration of the correction current generating circuit 40 according to the fourth embodiment. In the following, an operation of the correction current generating circuit 40 will be described in detail with reference to FIG. 7.

As shown in FIG. 7, the correction current generating circuit 40 includes a D/A converter 41, an operational amplifier circuit 42, a constant current source 43, PMOS transistors M41~M43, and a resistor R41.

The D/A converter 41 outputs a reference voltage Vref supplied to the control circuit 2 and a half voltage Vref/2 respectively. The half voltage Vref/2 is input to an inverting input terminal of the operational amplifier circuit 42. An output terminal of the operational amplifier circuit 42 is connected to a gate of the PMOS transistor M41. A source of the PMOS transistor M41 is connected to a drain of the PMOS transistor M42, and the resistor R41 is inserted between the drain of the PMOS transistor M41 and the ground Vss. A non-inverting input terminal of the operational amplifier circuit 42 is connected to a connecting portion between the PMOS transistor M41 and the resistor R41, and the constant current source 43 is inserted between the power input terminal IN10 and a connecting portion between the PMOS transistor M41 and the resistor R41.

The PMOS transistors M42 and M43 form a current mirror circuit. Sources of the PMOS transistors M42 and M43 are connected to the respective power input terminals IN11 and IN12. Gates of the PMOS transistors M42 and M43 are connected to each other. A connecting portion between the gates is connected to a drain of the PMOS transistor M42. The drain of the PMOS transistor M43 is connected to the connecting portion B shown in FIG. 6. The drain of the PMOS transistor M43 forms an output terminal of the correction current generating circuit 40, and the correction current i40 is supplied from the drain of the PMOS transistor M43.

In such a circuit configuration described above, the D/A converter 41 generates the reference voltage Vref in accordance with a command from outside the correction current generating circuit 40, and generates the half voltage Vref/2 in proportion to the reference voltage Vref. The output voltage Vout of the switching regulator 1c shown in FIG. 6 is varied in accordance with the half voltage Vref/2 which is varied in proportion to the reference voltage Vref determined by the command from outside the correction current generating circuit 40. Thus, the output voltage Vout is determined based on the half voltage Vref/2.

The operational amplifier circuit 42 controls a gate voltage of the PMOS transistor M41 so that a drain voltage of the PMOS transistor M41 becomes equal to the half voltage Vref/2. Constant current i41 is supplied to a connecting portion between the drain of the PMOS transistor M41 and the resistor R41 from the constant current source 43. Thus, current id41 supplied from the PMOS transistor M41 to the resistor R41 is expressed in a formula (7) as shown below. Herein, the resistance of the resistor R41 is indicated as r41.

$$id41 = Vref/(2*r41) - i41 \quad (7)$$

As shown in the formula (7), the current id41 is expressed as a function of the output voltage Vout.

The current id41 flows through the PMOS transistor M42 as a drain current thereof. The PMOS transistors M42 and M43 form a current mirror circuit. Drain current of the PMOS transistor M43, which is treated as correction current i40, is expressed in a formula (8) as shown below, wherein a size ratio of the PMOS transistors M42 and M43 is expressed as 1: K3.

$$i40 = K3*id41 \quad (8)$$

Since the current id41 is treated as a function of the output voltage Vout, and the correction current i40 is treated as a function of the output voltage Vout, current value of the correction current varies in proportion to the output voltage Vout. Thus, the correction current i40 becomes larger when the output voltage becomes larger, and the correction current i40 becomes smaller when the output voltage becomes smaller.

The current flowing through the connecting portion B is proportional to the constant current i2. Thus, current id34 flowing through the NMOS transistor M34 is expressed as a formula (9) as shown below by setting the constant currents i2 and i41 equal to each other. Thus, the current id34 becomes current in proportion to the output voltage Vout.

$$id34 = K3/r41*Vref/2 \quad (9)$$

Since the correction current i40 is added to drain current of the NMOS transistor M34 which constitute impedance element, a voltage drop due to the NMOS transistor M34 becomes larger as the correction current i40 becomes larger. Thus, the larger the current gradient of the current flowing through the synchronous rectifier transistor M2 becomes, the larger the voltage drop due to the NMOS transistor M34 becomes. And then, a gate-source voltage of the NMOS transistor M31 decreases, the drain current id7 decreases, and the voltage V6 increases. As a result, the voltage V6 becomes larger than the voltage V7 within an even shorter period, and the output of the comparator 31 is inverted into low level. It then becomes possible to correct the variation of the current of the synchronous rectifier transistor M2 due to the sensing delay time.

According to the current sensing circuit of the fourth embodiment, the same advantageous effect as that of the current sensing circuit of the third embodiment can be obtained. Further, the current sensing circuit of the fourth embodiment can keep the current value of the synchronous rectifier transistor M2 at the point in time when the sensing signal is output from the output terminal OUTN substantially constant by controlling the correction current i40 of the correction current generating circuit 40, in spite of the variation of the output voltage Vout. Thus, the current sensing circuit can sense the current of the synchronous rectifier transistor M2 with higher accuracy.

According to the fourth embodiment described above, the half voltage Vref/2 is input to the inverting input terminal of the operational amplifier circuit 42. The fourth embodiment is intended as illustrative only, and the voltage input to the inverting input terminal of the operational amplifier circuits 42 can be achieved at any value as long as the voltage is proportional to the output voltage Vout. For example, the voltage may be set to a voltage obtained by dividing the output voltage Vout with a voltage dividing resistor.

As described above, the switching regulators of the first to the fourth embodiments include a current sensing circuit which senses the current flowing through the switching transistor M1 or the synchronous rectifier transistor M2. The first to the fourth embodiments are intended as illustrative only, and the switching regulator may include the current sensing circuit which senses each current flowing through the switching transistor M1 and the synchronous rectifier transistor M2. In this case, the current sensing circuit may include the correction current generating circuit(s) 20 and/or 40.

According to the first and the second embodiments, the current sensing circuit 3 or 3a is applied to the synchronous rectifier type step down switching regulator. The first and the second embodiments are intended as illustrative only, and the current sensing circuit 3 or 3a may be applied to a non-synchronous rectifier type step down switching regulator. In such a case, the synchronous rectifier transistor M2 shown in FIG. 2 or 3 is replaced by a diode of which an anode and a cathode are connected to the ground Vss and the connecting portion LX, respectively. In this particular case, the diode constitutes a rectifier element.

The control circuit 2 of any one of the first to the fourth embodiments may be configured to detect excess current of the switching transistor M1 or the synchronous rectifier transistor M2 based on the signal output from the current sensing circuit, and turn off the switching transistor M1 or the synchronous rectifier transistor M2. In this particular case, another control circuit (not shown) disposed outside the switching regulator may be used in place of the control circuit in order to detect the excess current and turn off the switching transistor M1 or the synchronous rectifier transistor M2.

Further, the present invention is not limited to the aforedescribed embodiments, and variations and modifications may be made without departing from the scope of the present invention.

The present application is based on Japanese Priority Application No. 2008-144173 filed on Jun. 2, 2008 with the Japanese Patent Office, the entire contents of which are hereby incorporated by reference.

The invention claimed is:

1. A current sensing circuit configured to sense current flowing through a switching transistor of a non-insulated switching regulator,
wherein the non-insulated switching regulator includes:
the switching transistor being configured to perform switching in accordance with a first control signal input to a control terminal and to supply current supplied from a power input terminal to an inductor, and
a rectifier element being configured to carry current supplied from the inductor when the switching transistor is turned off, and wherein the non-insulated switching regulator is configured to convert the input voltage to a predetermined constant voltage and to output the predetermined constant voltage as an output voltage from an output terminal,
the current sensing circuit, comprising:
a voltage divider circuit portion configured to divide and output a voltage across the switching transistor;
a first transistor including a first current input terminal and a first output terminal, wherein the first current input terminal is connected to an output terminal of the voltage divider circuit portion, and wherein a predetermined first load is connected between the first current output terminal and the ground;
a first impedance element including first and second ends, wherein the first end is connected to the power input terminal and configured to be supplied with input voltage from the power input terminal, and wherein an impedance of the first impedance element varies in accordance with a second control signal;
a second transistor including a second current input terminal and a second current output terminal, wherein the second current input terminal is connected to the second end of the first impedance element, and wherein a predetermined second load is connected between the second current output terminal and the ground;
a third transistor including a third current input terminal and a third current output terminal, wherein the third current input terminal is connected to the second end of the first impedance element, and wherein a first constant current source is connected between the third current output terminal and the ground; and
a first voltage comparing circuit portion configured to compare a voltage at a connecting portion between the first transistor and the predetermined first load and a voltage at a connecting portion between the second transistor and the predetermined second load, and to output a signal indicating a comparison result of currents flowing through the switching transistor,
wherein control terminals of the first transistor, the second transistor, and the third transistor are connected to each other and a connecting portion of the control terminals is connected to a connecting portion between the third transistor and the first constant current source.

2. The current sensing circuit as claimed in claim 1, wherein the voltage divider circuit portion includes a fourth transistor configured to be input with the second control signal, and a fifth transistor configured to be input with the first control signal, wherein the fourth transistor and the fifth transistor are connected to each other by a connecting portion in series and connected to the switching transistor in parallel so as to output a divided voltage from the connecting portion.

3. The current sensing circuit as claimed in claim 2, wherein each of the fourth transistor and the fifth transistor is formed of a MOS transistor configured to be the same conductivity type as that of the switching transistor.

4. The current sensing circuit as claimed in claim 1, wherein the first impedance element is formed of a sixth transistor including a sixth control terminal, a sixth current input terminal, and a sixth current output terminal, wherein the second control signal is input to the sixth control terminal, the sixth current input terminal is connected to the power input terminal, and the sixth current output terminal is connected to the second and third current input terminals of the respective second and third transistors.

5. The current sensing circuit as claimed in claim 4, wherein the sixth transistor is formed of a MOS transistor configured to be the same conductivity type as that of the switching transistor.

6. The current sensing circuit as claimed in claim 1, further comprising a first correction current generating circuit configured to generate a first correction current in inverse proportion to a voltage difference between the input voltage and the output voltage of the non-insulated switching regulator, and to supply the first correction current to a connecting portion among the first impedance element, the second transistor, and the third transistor.

7. The current sensing circuit as claimed in claim 1, wherein the first constant current source is configured to set a first current value and output a constant current having the first current value, and wherein a current value for sensing current flowing through the switching transistor is determined by the first current value of the first constant current source.

8. A current sensing circuit configured to sense current flowing through a synchronous rectifier transistor of a non-insulated switching regulator,
wherein the non-insulated switching regulator includes:
a switching transistor being configured to perform switching in accordance with a first control signal input to a control terminal and to supply current supplied from a power input terminal to an inductor, and
the synchronous rectifier transistor being configured to carry current supplied from the inductor when the switching transistor is turned off, and wherein the non-insulated switching regulator is configured to convert the input voltage to a predetermined constant voltage and to output the predetermined constant voltage as an output voltage from an output terminal,
the current sensing circuit comprising:
a second impedance element including a first end and a second end, wherein the first end is connected to a connecting portion between the synchronous rectifier transistor and the inductor;
a seventh transistor including a seventh current input terminal and a seventh current output terminal, wherein the seventh current output terminal is connected to the second end of the second impedance element, and wherein a predetermined third load is connected between the seventh current input terminal and the power input terminal;
an eighth transistor including an eighth current input terminal and an eighth current output terminal, wherein the eighth current output terminal is connected to the ground, and wherein a predetermined fourth load is connected between the eighth current input terminal and the power input terminal;
a ninth transistor including a ninth current output terminal and a ninth current input terminal, wherein the ninth current output terminal is connected to the ground, and wherein a second constant current source is connected between the ninth current input terminal and the power input terminal; and a second voltage comparing circuit portion configured to compare a voltage at a connecting portion between the seventh transistor and the predetermined third load and a voltage at a connecting portion between the eighth transistor and the predetermined fourth load, and to output a signal indicating a comparison result of currents flowing through the switching transistor, wherein control terminals of the seventh transistor, the eighth transistor, and the ninth transistor are connected to each other and the connecting portion of the control terminals is connected to a connecting portion between the ninth transistor and the second constant current source.

9. The current sensing circuit as claimed in claim 8, wherein the second impedance element is formed of a tenth transistor including a tenth control terminal, a tenth current input terminal, and a tenth current output terminal, and wherein the tenth control terminal is connected to the control terminal of the synchronous rectifier transistor, the tenth current input terminal is connected to the seventh current output terminal, and the tenth current output terminal is connected to a connecting portion between the synchronous rectifier transistor and the inductor.

10. The current sensing circuit as claimed in claim 9, wherein the tenth transistor is formed of a MOS transistor configured to be the same conductivity type as that of the synchronous rectifier transistor.

11. The current sensing circuit as claimed in claim 8, further comprising a second correction current generating circuit configured to generate a second correction current in accordance with the output voltage of the non-insulated switching regulator, and to supply the second correction current to a connecting portion between the second impedance element and the seventh transistor.

12. The current sensing circuit as claimed in claim 8, wherein the second constant current source is configured to set a second current value and output a constant current having said second current value, and wherein a current value for sensing of current flowing through the synchronous rectifier transistor is determined by the second current value of the second constant current source.

13. A switching regulator comprising the current sensing circuit claimed in claim 1.

14. A switching regulator comprising the current sensing circuit claimed in claim 8.

* * * * *